(12) United States Patent
Blandford, III

(10) Patent No.: US 8,101,931 B2
(45) Date of Patent: Jan. 24, 2012

(54) RF SCREEN ASSEMBLY FOR MICROWAVE POWERED UV LAMPS

(75) Inventor: Joseph Bernard Blandford, III, Stevensville, MD (US)

(73) Assignee: Miltec Corporation, Stevensville, MD (US)

( * ) Notice: Subject to any disclaimer, the term of this patent is extended or adjusted under 35 U.S.C. 154(b) by 120 days.

(21) Appl. No.: 12/754,222

(22) Filed: Apr. 5, 2010

(65) Prior Publication Data

US 2011/0241546 A1    Oct. 6, 2011

(51) Int. Cl.
*H01J 1/52* (2006.01)
*H05K 3/06* (2006.01)

(52) U.S. Cl. ......... 250/504 R; 250/493.1; 250/365; 315/85; 315/39; 174/357; 29/592.1

(58) Field of Classification Search .......... 250/504 R, 250/493.1, 365; 315/85, 39; 174/357; 29/592.1
See application file for complete search history.

(56) References Cited

U.S. PATENT DOCUMENTS

| | | |
|---|---|---|
| 4,507,587 A | 3/1985 | Wood et al. |
| 4,842,687 A | 6/1989 | Jucha et al. |
| 5,811,936 A * | 9/1998 | Turner et al. .......... 315/39 |
| 6,752,884 B2 * | 6/2004 | Min .......... 148/518 |
| 6,841,790 B1 * | 1/2005 | Phillips et al. .......... 250/504 R |
| 7,906,911 B2 * | 3/2011 | Wood et al. .......... 315/39 |
| 7,977,659 B2 * | 7/2011 | Harper et al. .......... 250/504 R |
| 2009/0273932 A1 | 11/2009 | Wood et al. |
| 2009/0273937 A1 | 11/2009 | Harper et al. |
| 2010/0096569 A1 | 4/2010 | Nguyen |

OTHER PUBLICATIONS

Search Report and Written Opinion for PCT/US2010/029954 dated Jun. 1, 2010, 8 pages.

* cited by examiner

*Primary Examiner* — Nikita Wells
(74) *Attorney, Agent, or Firm* — Dority & Manning, P.A.

(57) ABSTRACT

An RF screen for microwave powered UV lamp systems is provided. The RF screen is formed of a single sheet of conductive material in which a mesh pattern has been formed. The screen includes a non-traditional mesh pattern including individual openings with 3 or more nodes. The RF screen is generally configured to optimize the balance between light transmission and RF energy leakage desired for the particular application. Generally, it is desired that the RF screen has an open area percentage greater than about 80% while limiting RF energy leakage from the microwave powered lamp system to acceptable levels.

26 Claims, 5 Drawing Sheets

RF SCREEN ASSEMBLY FOR MICROWAVE POWERED UV LAMPS

FIELD OF THE INVENTION

The present invention is in the technical field of microwave powered UV lamps, and particularly in the technical field of radio frequency (RF) screens utilized in microwave powered UV lamps.

BACKGROUND OF THE INVENTION

Ultraviolet (UV) lamp systems may be either microwave power UV lamp systems or medium pressure mercury vapor "ARC" lamp systems. UV lamp systems are used in high speed manufacturing processes to cure inks, coatings, photoresists, and adhesives in a variety of applications. These applications may include, for instance, decorating, laminating, hard-coat protection, circuit board conformal coatings, photoresist, photolithography, photostabilization, printing, and solar simulation. These systems have a wide range of uses and can be used, for example, in the curing of polymers such as photo polymer paints, the curing of inks and coatings, photo activation of adhesives, production of compact discs, and in photo resistant activation. A UV lamp produces high intensity radiation energy in the UV, visible, and infrared spectrums. This high intensity radiation energy may be used to cure inks, coatings, photoresists, and adhesives that are applied to a variety of substrates, such as paper, plastic film, wood, and metal.

The typical UV lamp system includes an irradiator to produce high intensity UV light, a power supply to provide electrical power to the irradiator, and an inter-connecting high voltage cable. The microwave powered UV lamp system has an irradiator that is equipped with one or more magnetrons. The magnetrons convert the electrical power received from the power supply to radio frequency (RF) energy in a range of generally from approximately 2445-2470 MHz. The microwave energy produced by the magnetrons in the irradiator is guided into a cavity which is encapsulated by an RF screen. An electrodeless medium pressure mercury-vapor lamp (or bulb) is positioned inside of this cavity. For UV curing applications, the bulb is typically formed in the shape of a tube with a slight "hour-glass" shape, and is constructed of quartz. For imaging and semi-conductor applications the bulb is typically spherical. The bulb may be filled with mercury, argon, and/or metal halides such as iron and gallium. The fill inside of the bulbs may absorb the microwave (RF) energy and, consequently, change to a plasma state. The plasma produces radiation energy in the UV lamp system which is in the form of UV, visible, and infrared energy.

The microwave powered UV lamp system is provided with an RF screen in order to capture and seal the RF energy within the cavity where the electrodeless bulb is positioned in the irradiator. The RF screen acts as a "faraday cage" as the openings in the screen are constructed to be smaller than the RF radiation wavelength preventing the RF energy from escaping (while simultaneously energizing the fill inside of the bulbs) and permitting light energy to be transmitted through the screen openings. For instance, a conventional RF screen assembly 10 is shown in FIGS. 1 and 2. The RF screen assembly 10 is composed of a metal frame 18 with a fine mesh screen 11 of individual square or rectangular openings 12 retained therein. As can be seen in FIG. 2, a metallic wire-woven mesh gasket 14 may be employed in order to provide a seal between a main reflector and end reflectors of the UV lamp system, and between the main reflector of the UV lamp system and the metal frame 18 of the RF screen assembly 10. The gasket 14 is compressed between the metal frame 18 and a reflector when the RF screen assembly 10 is attached.

During construction of conventional RF screen assemblies, a metal strip 15, such as stainless steel, is generally welded along each of the edges of the screen 11 to hold it securely in the metal frame 18 around the perimeter. However, formation of RF screen assemblies 10 with conventional RF screens 11 create undesirable manufacturing difficulties as the screens 11 are wavy and very flexible in nature resulting from the screen 11 being formed from woven individual metal wires of small diameter. Due to the fine mesh of conventional RF screens 11, manufacturers find it difficult to align the mesh screen 11 properly in the metal frame 18, fix the metal strips 15 properly over the edge of the screen 11 in order to prepare for welding, maintain the integrity of the screen 11 during the fixturing and welding of the assembly, and maintain proper alignment and proper tension of the screen 11 in the frame 18 during the welding process.

As noted above, the RF screen 11 prevents RF energy from escaping into the surrounding environment, and subsequently allows the bulb of the UV lamp system to light. A defective RF screen 11, such as one with a hole or other defect, allows RF energy to escape and prevent the bulb of the UV lamp system from lighting, or causes a reduced output in the bulb of the UV lamp system. Additionally, an improperly installed RF screen assembly 10 will cause arcing, and thus damage to components inside of the irradiator. Further, an RF screen assembly 10 with deformed or worn gaskets 14 will also cause arcing and damage to the irradiator.

Because the diameter of the wires making up the woven mesh is so small, the conventional RF screen mesh is delicate and susceptible to damage during the operation of the UV lamp or during maintenance of the UV lamp (such as removing or re-attaching the RF screen). Additionally, during operation of the UV lamp, the screen may be exposed to parts that can pass under the lamp and come in contact with the screen and potentially causing irreparable damage to the screen (such as creating tears and holes in the screen). If the individual wires are broken, the short lengths of wires may act as antennas in the RF field. The broken wire receives RF energy at such power to melt and erode away the end of the wire. If the screen is contaminated such that good electrical conductivity is not available between the broken wire and the crossing wires, the erosion process can continue until the wire erodes to the edge of the screen assembly 10.

The present invention improves upon current microwave UV lamp systems by providing for an improved RF screen and RF screen assembly that achieves improved light output.

BRIEF SUMMARY OF THE INVENTION

The present invention is directed to improved RF screen and RF screen assemblies for microwave powered UV lamp systems. Particularly, the RF screen of the present invention is formed of a single sheet of conductive material in which a desired mesh pattern has been formed. The mesh pattern in the sheet of conductive material can be formed from processes such as photo-chemical etching, chemical milling, stamping, laser cutting, plating, chemical etching, water jet or similar processes. A preferred process for forming the mesh pattern is photo-chemical etching. The sheet generally comprises a thickness from about 0.001 in. to about 0.015 in. and may be formed from any desirable conductive material. Of course, the thickness may be less than about 0.001 in. or greater than about 0.015 in. if so desired for a particular application. Typical sheets are formed from copper, brass, stainless steel, tungsten, or aluminum, but the invention is not limited to these metals. Metal alloys may also be utilized. One preferred metal alloy is nickel silver which comprises copper, zinc, and nickel (the alloy is named for its silvery appearance and not due to the presence of silver).

Photo-chemically forming the mesh pattern in the RF screen provides increased flexibility to the manufacturer to form non-traditional (i.e., other than square or rectangular) mesh patterns. The screens of the present invention include individual openings of with 3 or more nodes. In one embodiment, the individual openings are polygonal and have 5 or more nodes. For instance, in some embodiments, the openings are hexagonal or octagonal in shape. Additionally, the manufacturer may select a mesh pattern that is non-uniform to enhance light transmission in preferred areas of the screen. The RF screen is generally configured to optimize the balance between light transmission and RF energy leakage desired for the particular application. In one embodiment, the RF screen yields a light transmission (corresponding to the open area of the screen) of at least about 80% while sealing RF energy within a microwave powered lamp system within acceptable ranges. In a particularly preferred embodiment, the light transmission of the RF screen is at least about 92%. Of course, in some embodiments, the light transmission can be less than about 80% as dictated by certain applications. However, generally, the RF screens of the present invention provide improvement in light output over the RF screens used conventionally.

DETAILED DESCRIPTION OF THE INVENTION

Reference now will be made in detail to various embodiments of the invention, one or more examples of which are set forth below. Each example is provided by way of explanation, not limitation of the invention. In fact, it will be apparent to those skilled in the art that various modifications and variations may be made in the present invention without departing from the scope or spirit of the invention. For instance, features illustrated or described as part of one embodiment, may be used on another embodiment to yield a still further embodiment. Thus, it is intended that the present invention cover such modifications and variations.

Figure 3:
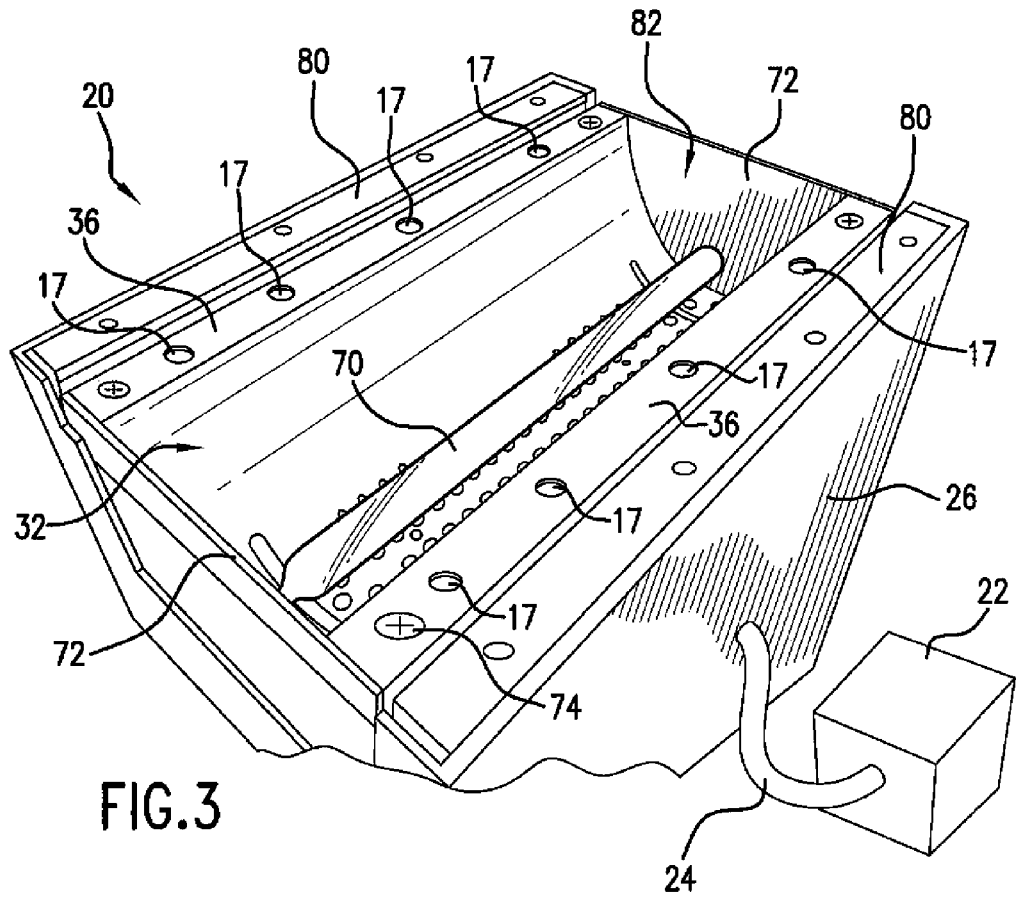
FIG. 3 is a perspective view of a UV lamp system.

A UV lamp system, generally 20, is shown in FIG. 3. The UV lamp system 20 includes a power supply 22 (not to scale) connected to an irradiator 26 through a cable 24. Irradiator 26 equipped with one or more magnetrons (not shown) produces high intensity UV light for the curing of objects. Irradiator 26 may include a reflector 32 that is attached thereto by one or more bolts 74. Reflector 32 may include a curved reflecting surface in order to properly focus UV light energy emitted from a bulb 70 contained within reflector 32. A pair of end reflectors 72 may also be included in irradiator 26 in order to further contain the RF energy and focus UV energy produced by bulb 70. In certain exemplary embodiments of the present invention, reflector 32 may include both curved reflecting surface and end reflectors 72. The curved reflecting surface may be either elliptical, parabolic, spherical, or of other configurations commonly known in the art in accordance with various exemplary embodiments of the present invention.

Figure 1:
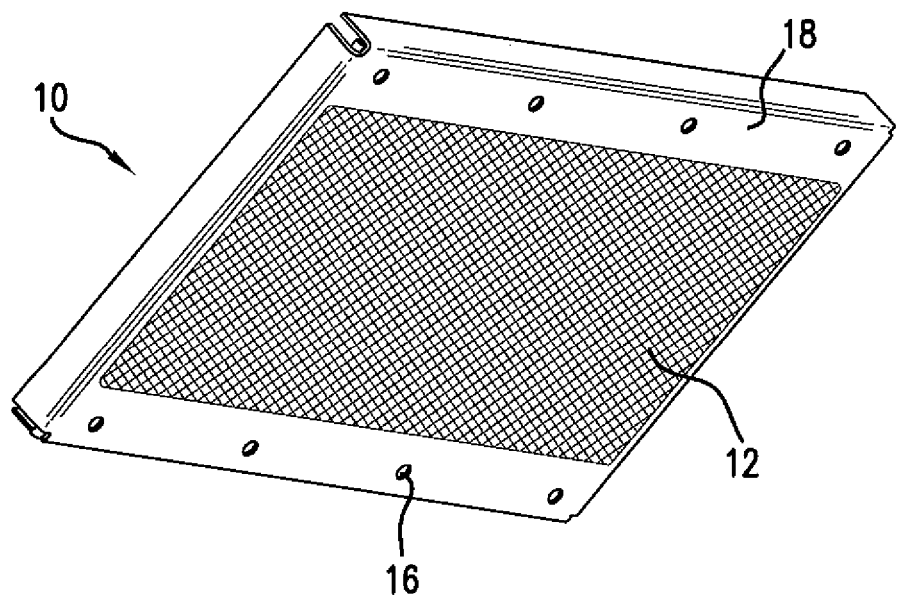
FIG. 1 is a top perspective view of a conventional RF screen assembly.
Figure 2:
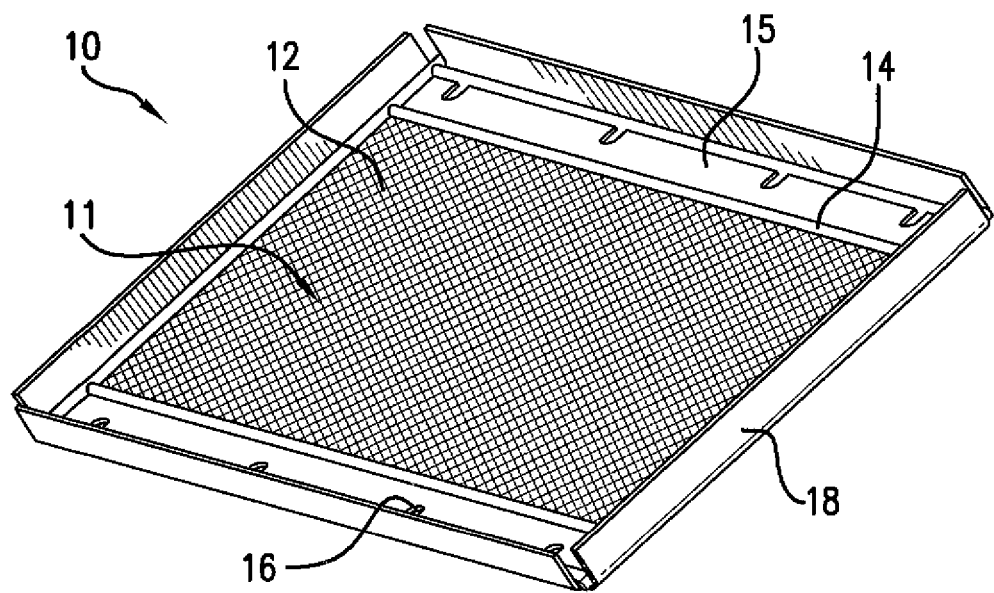
FIG. 2 is a bottom perspective view of the conventional RF screen assembly shown in FIG. 1.

An RF screen assembly 10 may be employed in order to captivate and seal RF energy within a cavity 82 in which bulb 70 is positioned and is defined by curved reflecting surface, end reflectors 72 and the RF screen 10. Conventional RF screens 11 (see FIGS. 1 and 2) are constructed of a fine woven metal mesh material and form a pattern of small squared or rectangular openings 12. The tension and weave configuration in the woven pattern allows the individual metal strands to come into contact with each other at the nodes of each individual square opening. However, since these individual wire strands are round in cross-section, the contact area between each wire is very small. Additionally, the contact integrity between each wire in the conventional woven screen can become disconnected over time due to screen distortion or due to contamination of dust or other particles collecting in the RF screen at the connecting nodes. This leads to a decrease in its electrical continuity and conductivity inhibiting the overall effectiveness of the RF screen as a "faraday cage." Detached wires, disconnected wires, contaminated wires, and broken wires in the woven mesh screen make it more susceptible to electrical arcing in the screen which degenerates the screen shortening its useful life. If the individual wires are broken, the short lengths of wires may act as antennas in the RF field. The broken wire receives RF energy at such power to melt the end of the wire, eroding away. If the contact area between the broken wire and the crossing wires are compromised, the erosion process can continue until the wire erodes to the edge of the screen assembly 10.

Figure 4:
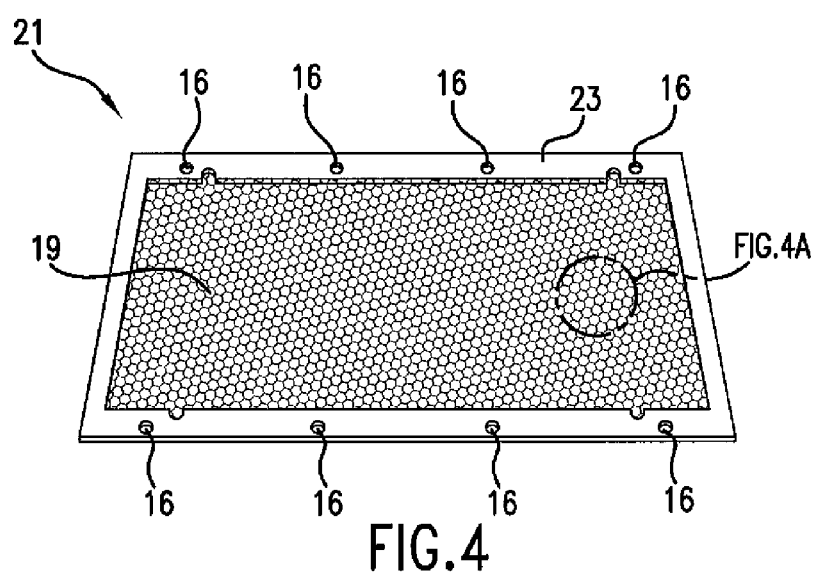
FIG. 4 is a perspective view of an exemplary embodiment of an RF screen in accordance with the present invention.

The novel RF screen 21 of the present invention overcomes the deficiencies of the conventional RF screens 11 noted above. Referring to FIG. 4, an RF screen 21 according to one embodiment is illustrated. The RF screen 21 may be formed from a single sheet of conductive material, usually a thin flat metal material) in which the mesh 19 is formed directly into the conductive sheet to produce a specific mesh or screen type pattern. The mesh can be formed by any process such as photo-chemical etching, chemical milling, stamping, laser cutting, plating, chemical etching, and water jet. Photo-chemical etching is especially preferred. Photo-chemically etching the RF screen 21 from a single sheet of conductive material provides the benefits of using virtually any flat conductive material to construct the RF screen 21. Different materials will have different properties (such as tensile strength, conductivity, resistivity, flexibility, appearance, etc). The application use of the RF screen 21 will help determine the specific requirements of the screen 21 and provides the screen manufacturer the flexibility to select a material that is best suited for that particular application. Some common materials to be used for creating the screen include copper, brass, stainless steel, tungsten, and aluminum. However, this design allows for virtually any flat conductive material to be a candidate for the RF screen. It is preferable that the material selected to be flat and relatively rigid to make full use of other beneficial properties.

Photo-chemically etching (or a comparable process) of the RF screen 21 provides greater flexibility in formation of the mesh pattern 19. For instance, the mesh pattern 19 of RF screen 21 of the present invention is not limited to the square or rectangular mesh pattern 12 of the conventional RF screens 11. As the conventional screens 11 are woven from fine individual strands, elaborate patterns (other than square or rectangular) are significantly more difficult if not impossible. The RF screen 21 of the present invention, however, is not limited to any particular mesh pattern 19. In addition to square or rectangular mesh patterns, the mesh pattern of the RF screen 21 may be triangular, polygonal (e.g., pentagons, hexagons, octagons, etc.), circular, oval, trapezoidal, parallelograms, and even non-uniform patterns. The shapes may be regular or irregular.

Figure 4A:
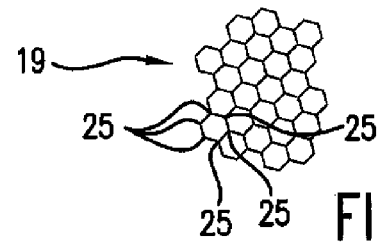
FIG. 4A is an enlarged view of the portion of the RF screen noted in FIG. 4.

Another advantage provided by the RF screens 21 of the present invention is that screen 21 allows for improved conductivity throughout the mesh pattern 19 over the life of the screen 21 compared to the conventional RF screen 11. Since the RF screen 21 uses a material constructed from a single conductive sheet, the nodes 25 (FIG. 4A) throughout the mesh 19 remain in contact in normal operating conditions. The conventional RF screen 11, woven out of individual strands of very small diameter metal wire, provides significant disadvantages regarding continual and optimum conductivity through the screen for the reasons noted previously. The RF screen 21 of the present invention may be a single coherent matrix of metal that will have increased nodes 25 and increased contact area over that of conventional RF screens 11. As a result, the RF screen 21 of the present invention will inherently maintain its integrity and connecting nodes 25 throughout the mesh pattern 19 of the screen 21, resulting in a screen 21 that will have and maintain a higher conductivity over the life of the screen 21 in normal operating conditions. In the event of a break in one of the bridges creating an "antenna" for RF energy, the broken bridge will erode to the nearest node 25 where erosion is halted due to the superior conductivity provided by the coherence of the base metal conductive sheet in contrast to the minimal surface contact of individual wires of conventional RF screens 11. Thus, in effect, a broken bridge in an RF screen 21 of the present invention will "self heal" rather than potentially continuing to erode as with conventional RF screens 11 with compromised conductivity between the individual wires.

While conductivity of the RF screen 21 is improved over that of a conventional RF screen 11 due to the ability to construct the RF screen 21 from a single conductive sheet, the inventors have found that conductivity can be further improved with a non-traditional mesh pattern. For instance, the inventors have found that an increase in the number of nodes, i.e., the contact points of each individual opening with an adjacent individual opening, over that of the conventional RF screen 11 may provide significant improvement in the overall conductivity of the screen. As the number of nodes in the conventional wire mesh woven screen 11 is four since it is limited to a square or rectangular mesh pattern 12, it is preferable that the individual openings of the RF screen 21 of the present invention include 3 or more nodes, preferably 5 or more nodes, and more preferably from 6 to 8 nodes. In one exemplary embodiment, individual openings including 6 nodes (e.g., hexagonal shaped) are utilized.

The flexibility of formation and patterning of the RF screen 21 of the present invention permits the manufacturer of the screen 21 to balance the properties of light transmission and the amount of RF energy that escapes from the screen (i.e., RF leakage) during use in a UV lamp system 20. As the size of the individual openings in the mesh increase, the total metal material of the mesh is decreased and thus, light transmission is increased. Conversely, as the size of the individual openings in the mesh increases, so too does the amount of RF energy that may escape the "faraday cage." Consequently, a well designed RF screen should preferably maximize the UV transmission through the RF screen, and yet contains the RF energy leakage to a safe level outside of the RF cavity 82 to ensure the safety of those that may be in close proximity to the equipment. Agencies, such as American National Standards Institute (ANSI), Occupational Safety and Health Administration (OSHA), Institute of Electrical and Electronics Engineers (IEEE), International Committee on Electromagnetic Safety (ICES), Federal Communications Commission (FCC), IEEE Committee on Man and Radiation (COMAR), and American Conference for Governmental Industrial Hygienists (ACGIH) have specified guidelines regarding the acceptable exposure limits to RF energy. For instance, the ACGIH threshold limit value for controlled (occupational) RF exposure is 10 $mW/cm^2$ (averaged over 6 minutes). For uncontrolled exposure (e.g., public areas), the IEEE exposure limit is 6.67 $mW/cm^2$. As such, it is desirable that the RF screens 21 yield minimal RF leakage (within specified guidelines) while simultaneously achieving an expected light transmission of greater than about 80%, preferably greater than about 85%, more preferably greater than about 88%, even more preferably greater than about 90%, and most preferably greater than about 92%. In one exemplary embodiment, expected light transmission of greater than about 94% may be obtained. The RF leakage will generally be less than 10 $mW/cm^2$, preferably less than 8 $mW/cm^2$, more preferably less than 5 $mW/cm^2$, and most preferably less than 3 $mW/cm^2$.

Such performance improvement over conventional RF screens 11 may be somewhat attributed to the non-traditional mesh patterns 19 (e.g., polygonal mesh patterns) utilized in the RF screens 21 of the present invention (see Examples below). Through the technique of formation of the mesh pattern 19 in the single sheet of conductive material, e.g., photo-chemical etching, the manufacturer is permitted to select the exact geometry and pitch size of the individual openings and pattern 19 of the etched screen for optimum efficiently for the particular application for which it is intended. Having such flexibility in selecting a pattern 19 also provides the opportunity to specify a non-uniform geometric pattern by altering the geometry of the individual mesh openings across the open transmission area of the RF screen 21 to maximize the UV light transmission through the RF screen 21 in the most critical areas of transmission.

Referring again to FIGS. 1 and 2, an assembled RF screen assembly 10 is illustrated. Conventionally, the RF screen assembly 10 is formed by positioning the fine wire woven screen 11 in the metal frame 18. A gasket 14 is generally disposed on the screen 11 and functions to create a seal via continuous metal-to-metal contact between the surface of the reflector 32 and the end reflectors 72, and the surface of the reflector 32 and metal frame 18 of the RF screen assembly 10. Without such a seal, RF energy may escape into the surrounding environment and prevent bulb 70 from lighting. The gasket 14 may be a metal fabric wrapped around an elastomer sponge core center gasket. The shape of the gasket 14 can vary depending upon the shape of other components in the UV lamp system 20, and as such can be constructed in any shape or size in order to affect a proper seal. After placing the gasketing 14, metal strips 15 are placed and aligned over at least both of the long edges and spot welded in place to secure the screen 11 and gasketing 14 in frame 18 forming the RF screen assembly 10.

As noted previously, conventional screens 11 are formed from woven fine wires. The resulting screen 11 is wavy, flexible, and becomes very non-uniform in its shape after it has been cut to the desired length and width. To complicate matters, the individual wire strands will naturally become detached from the edges of the frame 18. Such properties cause manufacturing difficulties as it requires substantial effort to align the screen 11 properly in the frame 18, place the metal strips 15 properly in the frame to prepare for welding, and maintain the integrity of the screen 11 as well as maintaining the alignment and proper tensioning of the screen 11 in the frame 18 during the welding of the metal strips 15.

Figure 5:
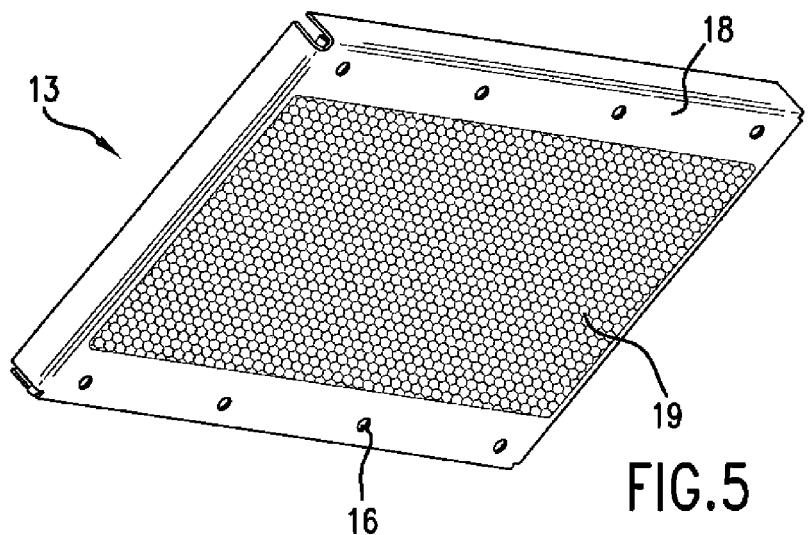
FIG. 5 is a top perspective view of an exemplary RF screen assembly in accordance with the present invention.
Figure 6:
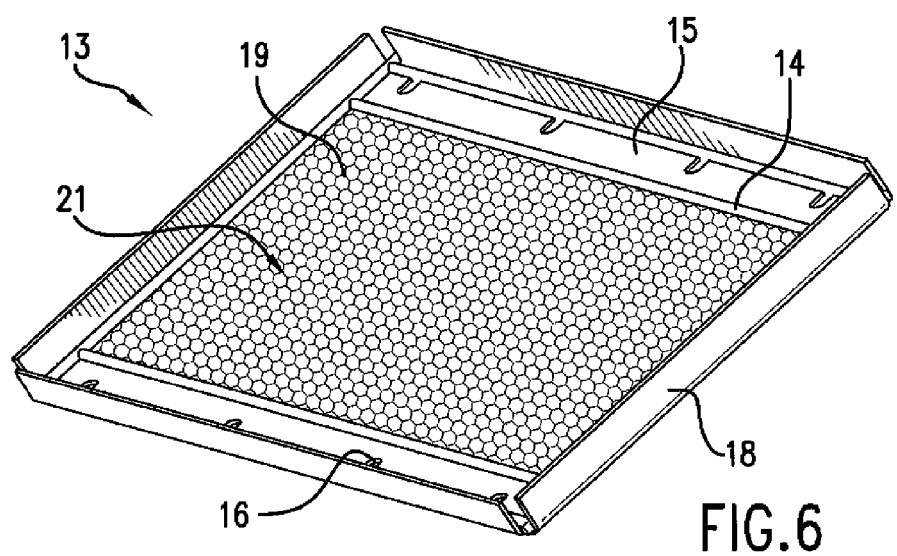
FIG. 6 is a bottom perspective view of the RF screen assembly shown in FIG. 5.

Referring to FIGS. 4, 5 and 6, the method for forming the RF screen assembly 13 of the present invention is similar to the conventional method described above. However, the RF screens 21 of the present invention provide a significant advantage to manufacturers in the formation of the RF screen assembly 13. The welding and construction of the RF screen assembly 13 is quicker and easier due to the increased rigidity. The flat rigid properties, along with making use of the border with a series of holes 16, of the RF screen of the present invention enables a substantially easier RF screen assembly 13 construction allowing the manufacturer to readily install and properly align the screen 21 in the frame 18. During welding, the position and alignment is much easier to maintain as the manufacturer does not have to be concerned about maintaining the proper tensioning of the screen in all directions.

Figure 7:
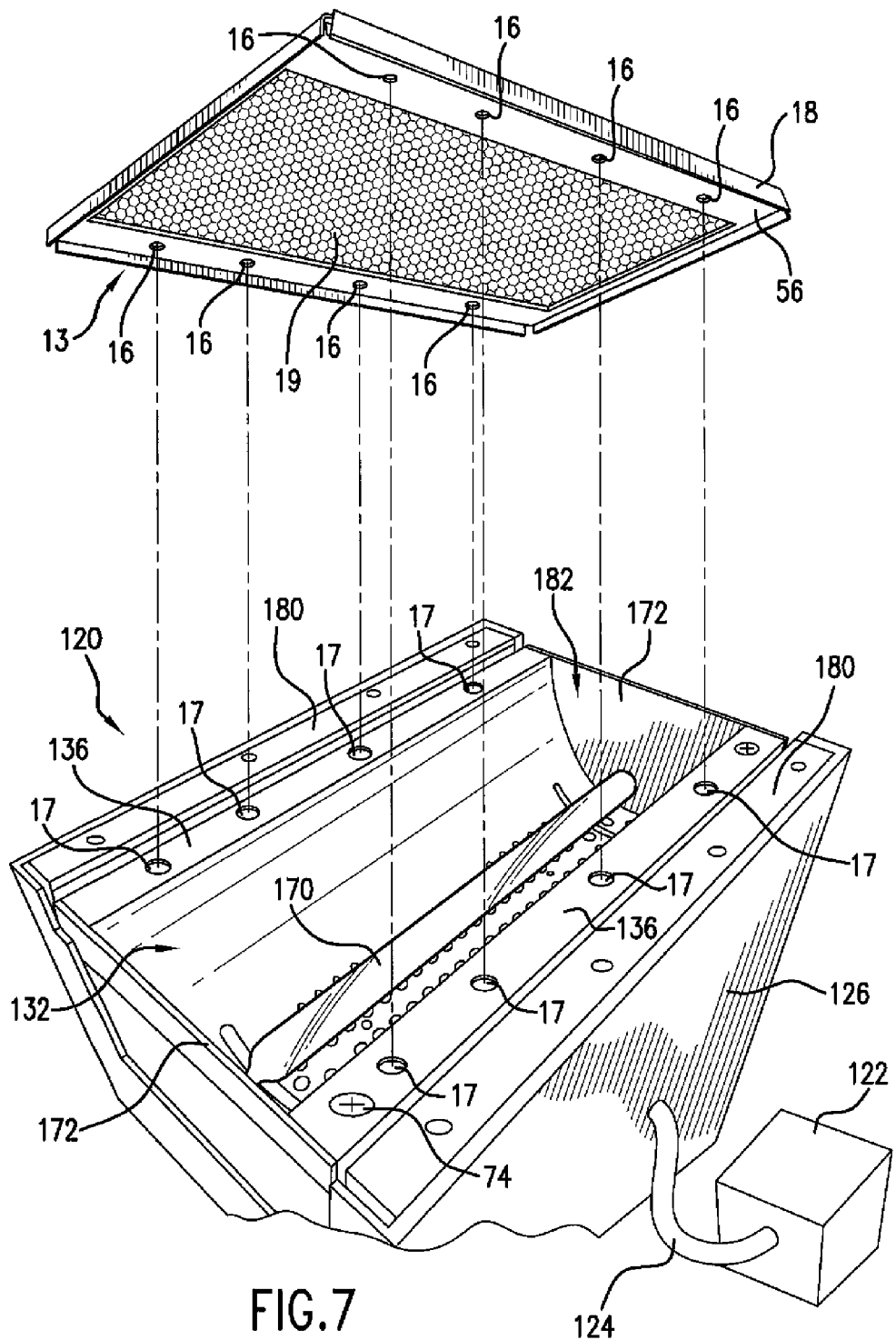
FIG. 7 is a perspective/partially exploded view of a UV lamp system utilizing an RF screen assembly in accordance with one exemplary embodiment of the present invention.

As the RF screen 21 is generally formed from a single conductive sheet, the screen 21 may be readily constructed to include a border 23 at least along one or more sides. The border 23 may be readily equipped with the holes 16 that are generally required for attachment of the RF screen assembly 13 to the UV lamp system 120 (FIG. 7). Formation of the holes 16 in the border 23 of the screen 21 prior to construction of the RF screen assembly 13 further alleviates aforementioned conventional manufacturing difficulties as, the hole pattern in the border 23 may be readily matched to the hole pattern of the metal strips 15 and the frame 18. Thus, the screen 21 may self-align upon placing in the frame 18 for welding.

Referring to FIG. 7, a UV lamp system 120 used in accordance with one embodiment of the present invention is illustrated. The UV lamp system 120 includes a power supply 122 (not to scale) connected to an irradiator 126 through a cable 124. The irradiator is equipped with one or more magnetrons (not shown) that convert the electrical power received from the power supply 122 to RF energy generally between about 2445 to 2470 MHz. Of course, the RF frequency may be altered as required for different applications. The microwave energy produced by the magnetrons in the irradiator is guided into a cavity 182. The cavity 182 includes a curved reflector 132, end reflectors 172, and an electrodeless bulb 170. As illustrated, an RF screen assembly 13 formed according to the present invention is attached to the flanges 136 of the curved reflector 132. The screen assembly 13 may additionally (or alternatively) be secured along the irradiator rails 180.

One skilled in the art appreciates that the attachment of the screen assembly 13 to the irradiator 126 may be by any means that yields a sufficient seal. Typically, the screen assembly 13 is attached to the irradiator 126 with screws through corresponding screen assembly holes 16 and curved reflector holes 17. However, the RF screen assembly 13, the curved reflector 132, or both may include any other fastening means such as, for instance, snap-fit fasteners, magnetic fasteners, etc. For instance, the RF screen assembly 13 may be attached utilizing quick release fasteners such as those disclosed in U.S. Pat. No. 6,841,790, incorporated herein by reference.

While FIGS. 4-7 illustrate the RF screen 21 of the present invention as linear, the present invention is not limited to linear RF screens 21. Certain applications, e.g., photolithography in manufacturing of semiconductor wafers, may require a spherical electrodeless bulb and, consequently, a non-linear RF screen 21 (e.g., cylindrical-shaped RF screen 21). The RF screen 21 is generally preferred to be linear (e.g., rectangular), however, a non-linear RF screen 21 may be constructed in accordance with the present invention.

EXAMPLE 1

Figure 8:
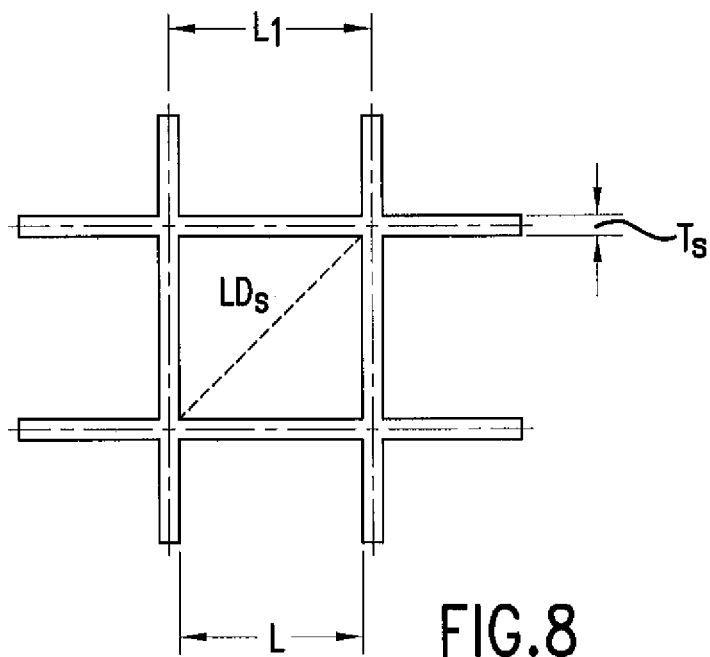
FIG. 8 is an enlarged view of a square-shaped individual opening.

In a typical microwave UV lamp system 20 (e.g., FIG. 3), an estimated 70% of the UV light produced by the bulb will be reflected by the UV reflector(s) and directed through the RF screen to the object that is being exposed. The remaining 30% of the light from the UV bulb is directed through the RF screen without the aid of the reflector. Of the UV light directed toward the RF screen, a significant amount of light, proportional to the percentage of the area occupied by the mesh will be blocked by the screen. In this Example, the expected light transmission (which corresponds to the open area percentage, or transparency, of the RF screen) of a conventional RF screen formed from fine woven wires (e.g., FIGS. 1 and 2) was computed and compared to the expected light transmission of an RF screen of the present invention with regular hexagonal shaped mesh openings. FIG. 8 illustrates the measurements required to compute the expected light transmission.

Conventional Square Mesh

The expected light transmission percentage for the square mesh pattern ($LT_S\%$) is computed as follows:

$$LT_S\% = 100\% \times A_{OS}/A_{TS},$$

where $A_{OS}$ is the open area of the square and $A_{TS}$ is the total area of the square. $A_{OS}$ and $A_{TS}$ are computed as follows:

$$A_{OS} = L^2$$

$$A_{TS} = L_1^2 = (L+T_S)^2$$

where L is the open area length of the square as illustrated in FIG. 8, $T_S$ is the thickness of the wire bridge to the adjacent opening as illustrated in FIG. 8, and $L_1$ is the length of the square measured from the respective mid-points of the bridges (thus, $L_1 = L + T_S$) as illustrated in FIG. 8.

Hexagon Mesh

The expected light transmission percentage for the hexagon mesh pattern ($LT_H\%$) in accordance with the present invention is computed as follows:

$$LT_H\% = 100\% \times A_{OH}/A_{TH},$$

where $A_{OH}$ is the open area of the hexagon and $A_{TH}$ is the total area of the hexagon. $A_{OH}$ and $A_{TH}$ are computed as follows:

$$A_{OH} = \frac{\sqrt{3}}{2} \times D^2$$

$$A_{TH} = \frac{\sqrt{3}}{2} \times D_1^2 = \frac{\sqrt{3}}{2}(D+T_H)^2$$

where D is the diameter of an inscribed circle (i.e., the distance between two parallel sides) as illustrated in FIG. 8, $T_H$ is the thickness of the bridge to the adjacent opening as illustrated in FIG. 8, and $D_1$ is the length from the mid-point of one bridge to the mid-point of the parallel bridge of the hexagon (thus, $D_1=D+T_H$) as illustrated in FIG. 8.

In this example, a conventional RF screen with square openings was measured to determine the open area length (L) and the thickness of the wire bridge ($T_S$). L was measured as 0.0303" and $T_S$ was 0.0015" corresponding to an expected light transmission percentage ($LT_S\%$) of 90.79%.

An RF screen with hexagon-shaped openings formed according to the present invention was constructed with an inscribed circle diameter (D) of 0.0999" and a bridge thickness ($T_H$) of 0.0031", corresponding to an expected light transmission ($LT_H\%$) of 94.07%.

As indicated above, the values computed are the expected, or theoretical, values for light transmission. Actual light transmission, measured with a UV light radiometer, was measured to be slightly less than the expected values. Without intending to be limited by theory, it is believed that actual light transmission is slightly lower than expected light transmission due mainly to the thickness of the screen which can absorb/reflect a small portion of light. Thus, theoretically, a thicker gauge screen material will cause the actual light transmission to be slightly less than a comparable thinner gauge screen material.

EXAMPLE 2

One of the benefits of utilizing a mesh pattern with 5 or more nodes was demonstrated. As indicated above, RF screens function as a "faraday cage" in order to block RF energy from escaping. Thus, the amount of RF energy that "leaks" from the RF screen correlates to the largest dimension of the individual mesh openings. The inventors have discovered that the RF screens of the present invention are capable of permitting more light transmission without sacrificing an increase in RF leakage.

Figure 9:
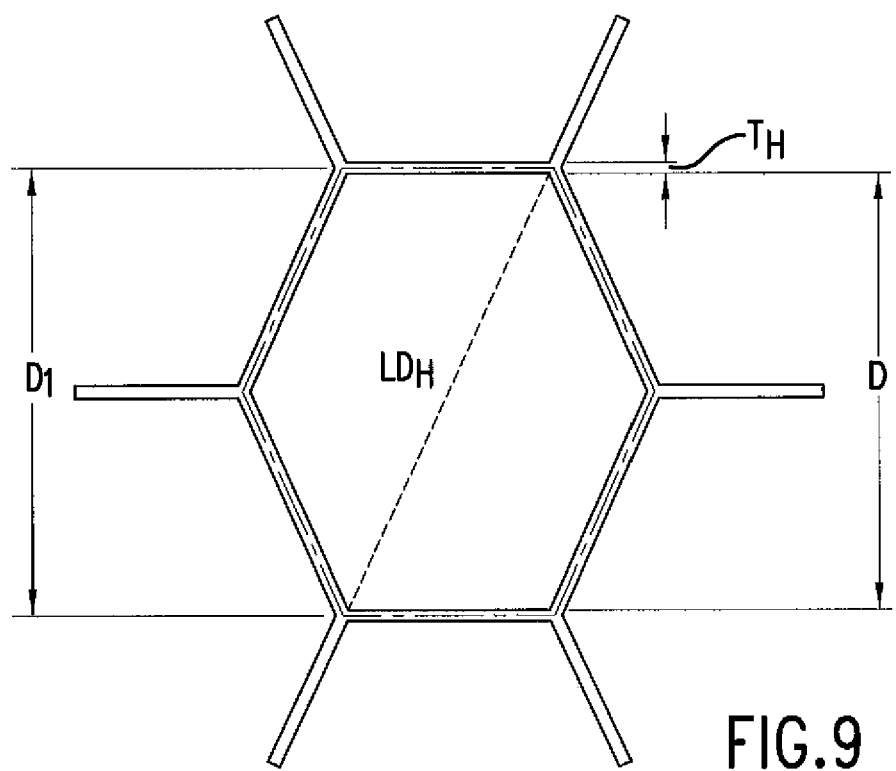
FIG. 9 is an enlarged view of a regular hexagon-shaped individual opening.

As shown in FIG. 8, the "largest dimension" of the individual openings of a conventional RF screen with square or rectangular mesh is the diagonal (shown as a dashed line $LD_S$). For a square, this dimension can be represented as $LD_S=\sqrt{2}(L)$. In contrast, the "largest dimension" of the individual openings of an RF screen of the present invention utilizing hexagon-shaped openings (shown as dashed line $LD_H$) corresponds to the distance between one node and the corresponding diagonal node (i.e., 180°) as shown in FIG. 9. This value corresponds to twice the hexagon side length. For a hexagon, this dimension may also be represented as $$LD_H = \frac{2}{\sqrt{3}}(D).$$

As such, for comparison purposes, if the open area of the individual square openings of the mesh for a conventional RF screen were 1 in.$^2$ (corresponding to L=1"), the largest opening would be $LD_S=\sqrt{2}(1")$ which equals 1.41". Conversely, if the open area of the individual hexagon openings of the mesh for an RF screen of the present invention were 1 in.$^2$ (corresponding to D=1.075"), the largest opening would be $$LD_H = \frac{2}{\sqrt{3}}(1.075")$$

which equals 1.24". Thus, while the two RF screens exhibit individual openings of the same area, the RF screens of the present invention, utilizing hexagon-shaped openings, have a substantially smaller "largest dimension" (in this example, the conventional RF screen largest dimension is about 14% larger). Accordingly, RF screens with 5 or more nodes formed according to the present invention exhibit increased light transmission over conventional RF screens (assuming equal RF leakage values).

It should be noted that the above Examples are simply for illustrative purposes. The particular pattern and geometric size can be optimized for the desired application. However, the pattern and geometric size of the individual openings will generally be selected to yield a light transmission greater than that of conventional RF screens while maintaining a level less than the maximum desired allowable RF leakage. Generally, the open area percentage (i.e., expected light transmission) of the RF screens of the present invention will be greater than about 80%, preferably greater than about 85%, more preferably greater than about 88%, even more preferably greater than about 90%, and most preferably greater than about 92%. In one exemplary embodiment, an open area percentage of greater than about 94% may be obtained. The individual mesh opening area will generally be less than about 0.05 in$^2$, such as from about 0.0005 in$^2$ to about 0.05 in$^2$, preferably from about 0.0008 in$^2$ to about 0.05 in$^2$, more preferably from about 0.001 in$^2$ to about 0.05 in$^2$, and most preferably from about 0.005 in$^2$ to about 0.05 in$^2$. The screen gauge or thickness will generally be from about 0.0001 in. to about 0.1 in, preferably from 0.001 in. to about 0.015 in., and more preferably from about 0.002 in. to about 0.008 in.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

What is claimed:

1. An RF screen for a microwave powered UV lamp system, comprising:
    a unitary sheet of conductive material,
    wherein the conductive material defines a predetermined mesh pattern of individual openings across substantially the operative area of the screen,
    wherein the mesh pattern includes an open area percentage of greater than about 80% wherein the mesh pattern comprises individual openings in the shape of hexagons, and
    wherein the individual openings comprise 3 or more nodes.

2. The RF screen of claim 1, wherein the individual openings comprise 5 or more nodes.

3. The RF screen of claim 1, wherein the mesh pattern has been photo-chemically etched into the sheet of conductive material.

4. The RF screen of claim 1, wherein the sheet of conductive material comprises copper, brass, stainless steel, tungsten, aluminum, nickel silver, or combinations thereof.

5. The RF screen of claim 1, wherein the mesh pattern is non-uniform.

6. The RF screen of claim 1, wherein the RF screen is self healing in that a broken bridge in the mesh pattern will erode only to the nearest node.

7. The RF screen of claim 1, wherein the RF screen comprises an open area percentage greater than about 85%.

8. The RF screen of claim 1, wherein the RF screen comprises an open area percentage greater than about 90%.

9. The RF screen of claim 1, wherein the RF screen comprises an open area percentage greater than about 92%.

10. The RF screen of claim 1, wherein the sheet comprises a thickness of from about 0.001 in. to about 0.015 in.

11. The RF screen of claim 1, wherein the screen further includes a non-mesh border along at least one of the edges.

12. The RF screen of claim 1, wherein the individual openings in the mesh pattern comprise an area of less than about 0.05 in$^2$.

13. The RF screen of claim 1, wherein the RF screen is configured to yield an increase in light transmission in comparison to a screen with a mesh pattern comprising square- or rectangular-shaped individual openings of the same open area.

14. An RF screen assembly for a microwave powered UV lamp system comprising the RF screen of claim 1, the RF screen assembly further comprising a metal frame and gasketing.

15. A microwave powered UV lamp system comprising:
a power supply;
a cable connected to the power supply;
an irradiator connected to the cable and powered by the power supply, the irradiator comprising at least one magnetron configured to convert electrical power received from the power supply to radio frequency energy;
an electrodeless bulb; and
an RF screen assembly comprising an RF screen attached to the irradiator, the screen comprising a unitary sheet of conductive material that defines a predetermined mesh pattern of individual openings, the mesh pattern having an open area percentage greater than about 80% wherein the mesh pattern comprises individual openings in the shape of hexagons, and the individual openings comprising 3 or more nodes.

16. The microwave powered UV lamp system of claim 15, wherein the individual openings comprise 5 or more nodes.

17. The microwave powered UV lamp system of claim 15, wherein the mesh pattern has been photo-chemically etched into the sheet of conductive material.

18. The microwave powered UV lamp system of claim 15, wherein the sheet of conductive material comprises copper, brass, stainless steel, tungsten, aluminum, or combinations thereof.

19. The microwave powered UV lamp system of claim 15, wherein the RF screen is linear.

20. The microwave powered UV lamp system of claim 15, wherein the RF screen comprises an open area percentage greater than about 90%.

21. The microwave powered UV lamp system of claim 15, wherein the sheet comprises a thickness of from about 0.001 in. to about 0.015 in.

22. The microwave powered UV lamp system of claim 15, wherein the screen further comprises a non-mesh border along at least one of the edges.

23. The microwave powered UV lamp system of claim 15, wherein the individual openings in the mesh pattern comprise an open area of less than about 0.05 in$^2$.

24. The microwave powered UV lamp system of claim 15, wherein the RF screen is configured to yield an increase in light transmission in comparison to a screen with a mesh pattern comprising square- or rectangular-shaped individual openings of the same area.

25. A process for forming an RF screen for a microwave powered UV lamp system, comprising:
forming a mesh pattern into a single sheet of conductive material,
wherein the mesh pattern comprises individual openings, the individual openings comprising 3 or more nodes,
wherein the RF screen comprises an open area percentage greater than about 80% and wherein the mesh pattern comprises individual openings in the shape of hexagons.

26. The process of claim 25, further comprising photo-chemically etching the single sheet of conductive material to form the mesh pattern.

* * * * *